United States Patent
Asako et al.

(10) Patent No.: US 8,101,507 B2
(45) Date of Patent: Jan. 24, 2012

(54) SEMICONDUCTOR DEVICE MANUFACTURING METHOD AND SEMICONDUCTOR DEVICE MANUFACTURING APPARATUS

(75) Inventors: Ryuichi Asako, Yamanashi (JP); Gousuke Shiraishi, Tokyo (JP); Shigeru Tahara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 69 days.

(21) Appl. No.: 12/580,495

(22) Filed: Oct. 16, 2009

(65) Prior Publication Data

US 2010/0099256 A1    Apr. 22, 2010

(30) Foreign Application Priority Data

Oct. 21, 2008   (JP) .................. 2008-270831

(51) Int. Cl.
*H01L 21/3205* (2006.01)
*H01L 21/308* (2006.01)
(52) U.S. Cl. ........ 438/475; 438/725; 438/689; 438/694; 438/623; 257/E21.231; 257/E21.295
(58) Field of Classification Search .................. 438/623, 438/675, 694
See application file for complete search history.

(56) References Cited

U.S. PATENT DOCUMENTS

| 2007/0134435 A1 | 6/2007 | Ahn et al. |
| 2008/0057717 A1* | 3/2008 | Owada et al. .................. 438/694 |

FOREIGN PATENT DOCUMENTS

| JP | 2006-049798 A | 2/2006 |
| KR | 10-2007-0019774 A | 2/2007 |
| KR | 10-2008-0076847 A | 8/2008 |

OTHER PUBLICATIONS

Korean Office action for 10-2009-0098166 dated Mar. 28, 2011.
Japanese Office action for 2008-270831 dated Nov. 9, 2010.

* cited by examiner

*Primary Examiner* — N Drew Richards
*Assistant Examiner* — Mamadou Diallo
(74) *Attorney, Agent, or Firm* — Pearne & Gordon LLP

(57) ABSTRACT

There is provided a semiconductor device manufacturing apparatus and a semiconductor device manufacturing method capable of recovering a damage of a low dielectric insulating film exposed to $CO_2$ plasma to obtain the low dielectric insulating film in a good state, thus improving performance and reliability of a semiconductor device. The semiconductor device manufacturing method includes: an etching process for etching a low dielectric insulating film formed on a substrate; a $CO_2$ plasma process for exposing the substrate to $CO_2$ plasma after the etching process; and a UV process for irradiating UV to the low dielectric insulating film after the $CO_2$ plasma process.

5 Claims, 14 Drawing Sheets

Mass=18($H_2O$)

Mass=19(F)

SEMICONDUCTOR DEVICE MANUFACTURING METHOD AND SEMICONDUCTOR DEVICE MANUFACTURING APPARATUS

FIELD OF THE INVENTION

The present disclosure relates to a semiconductor device manufacturing method and a semiconductor device manufacturing apparatus for manufacturing a semiconductor device by performing an etching process, a $CO_2$ plasma process, and so forth.

BACKGROUND OF THE INVENTION

Conventionally, in a manufacturing process of a semiconductor device, a circuit pattern is formed by performing a series of processes such as an etching process for etching an interlayer insulating film or the like formed on a substrate such as a semiconductor wafer and an asking process for removing a photoresist layer, which is used as a mask in the etching process, by oxygen plasma or $CO_2$ plasma.

Recently, a low dielectric insulating film (so-called a Low-k film) having a lower dielectric constant than that of a conventionally used $SiO_2$ film has been used as the interlayer insulating film. A film called a carbon-containing silicon oxide film or the like containing silicon, carbon, oxygen and hydrogen (hereinafter, referred to as a "SiCOH" film) has received recent interest for its usage as a low dielectric insulating film. As compared to the $SiO_2$ film having a dielectric constant of about 4, the SiCOH film having a dielectric constant equal to or less than about 2.7 is a very useful film to be used as the interlayer insulating film because it has a sufficient mechanical strength. Further, a p-SiCOH film made of a porous SiCOH film may be also employed.

However, if the above-mentioned p-SiCOH film or the like is exposed to plasma in the etching process or the ashing process, it would be damaged, resulting in problems such as performance deterioration or reliability degradation because of an increase of hygroscopic property or dielectric constant. Such a damage is deemed to be inflicted because a dielectric constant is increased by removing carbon from the low dielectric insulating film and the low dielectric insulating film comes to contain moisture by absorbing water readily.

In this regard, there is known a method for recovering the damaged low dielectric insulating film by performing a silylation process for silylating the low dielectric insulating film by contacting the low dielectric insulating film with vapor of a silylating agent (for example, TMSDMA (Dimethylaminotrimethylsilane)) or the like after the etching or the ashing process (see, for example, Patent Document 1).

Patent Document 1: Japanese Patent Laid-open Publication No. 2006-49798

BRIEF SUMMARY OF THE INVENTION

When recovery of the damage (increase of hygroscopic property or dielectric constant) on the low dielectric insulating film by the etching or ashing is attempted, the damage can be recovered to some extent by the above-stated silylation process in case that the low dielectric insulating film is etched by plasma etching using an etching gas such as $CF_4$ and a photoresist layer used as a mask in the etching process is later asked by oxygen plasma.

However, in case that the ashing process is performed not by the oxygen plasma but by $CO_2$ plasma, the recovery of the damage cannot be accomplished sufficiently even if the silylation process is conducted because damages inflicted on the low dielectric insulating film are deemed to be different in two cases where the ashing is performed by the oxygen plasma and by the $CO_2$ plasma.

That is, when the ashing is performed by the oxygen plasma, the damage that the low dielectric insulating film suffers is mainly oxidation. Meanwhile, when the ashing is performed by the $CO_2$ plasma, the damage inflicted on the low dielectric insulating film is deemed to include formation of a film (containing C, F, O and the like as composition) impeding silylation on the surface of the low dielectric insulating film as well as oxidation thereof. Further, it is deemed that when the ashing is conducted by the $CO_2$ plasma, F components originated from $CF_4$ used in the etching process may remain or diffuse in the low dielectric insulating film, whereby polarity of the low dielectric insulating film increases, resulting in absorption of moisture and consequent increase of dielectric constant.

Moreover, when the ashing is performed by the oxygen plasma, though the damage on the low dielectric insulating film can be recovered to some extent by the silylation process, the oxidizing power of the oxygen plasma is so strong that the damage inflicted on the low dielectric insulating film reaches even a deep layer portion as well as a surface portion thereof and an oxidized portion is densified. Thus, it is required to perform the ashing by using the $CO_2$ plasma having a smaller oxidizing power to thereby limit the damage inflicted on the low dielectric insulating film to a vicinity of its surface portion. Moreover, as in the case of the $CO_2$ plasma ashing, the above-mentioned damage caused by the $CO_2$ plasma may be also generated when using the $CO_2$ plasma in other processes, but not limited to the $CO_2$ plasma ashing process, such as a cleaning process for removing adhered deposits after the plasma etching process.

In view of the foregoing, the present disclosure provides a semiconductor device manufacturing method and a semiconductor device manufacturing apparatus capable of obtaining a low dielectric insulating film in a good state by recovering a damage such as an increase of hygroscopic property or dielectric constant of the low dielectric insulating film exposed to $CO_2$ plasma, thus improving performance and reliability of a semiconductor device.

In accordance with one aspect of the present invention, there is provided a semiconductor device manufacturing method including: an etching process for etching a low dielectric insulating film formed on a substrate; a $CO_2$ plasma process for exposing the substrate to $CO_2$ plasma after the etching process; and a UV process for irradiating UV to the low dielectric insulating film after the $CO_2$ plasma process.

In the semiconductor device manufacturing method, the $CO_2$ plasma process may be a $CO_2$ plasma asking process for removing a photoresist layer used as an etching mask in the etching process.

In the semiconductor device manufacturing method, the $CO_2$ plasma process may be a cleaning process for removing deposits generated in the etching process.

The semiconductor device manufacturing method may further include a silylation process for silylating the low dielectric insulating film after the $CO_2$ plasma process.

In accordance with another aspect of the present disclosure, there is provided a semiconductor device manufacturing apparatus including: an etching processing mechanism for performing an etching process that etches a low dielectric insulating film formed on a substrate; a $CO_2$ plasma processing mechanism for performing a $CO_2$ plasma process that exposes the substrate to $CO_2$ plasma after the etching process; a UV processing mechanism for performing a UV process that irradiates UV to the low dielectric insulating film after the $CO_2$ plasma process; and a transfer mechanism for transferring the substrate.

The semiconductor device manufacturing apparatus may further include a silylation processing mechanism for performing a silylation process that silylates the low dielectric insulating film after the UV process.

In the semiconductor device manufacturing apparatus, the silylation processing mechanism and the UV processing unit may be installed in a single chamber so as to perform the UV process and the silylation process in the same chamber.

In the semiconductor device manufacturing apparatus, the chamber may include therein: a silylating agent vapor supply mechanism for supplying vapor of a silylating agent into the chamber; and a nitrogen gas supply unit for supplying a nitrogen gas into the chamber, independently of the silylating agent vapor supply mechanism.

In the semiconductor device manufacturing apparatus, the transfer mechanism may be installed in a vacuum chamber to transfer the substrate under a vacuum atmosphere.

In accordance with still another aspect of the present disclosure, there is provided a semiconductor device manufacturing method including: a mask forming process for forming an etching mask, which has a preset circuit pattern, on a surface of a low dielectric insulating film formed on a substrate; an etching process for forming a groove or a hole in the low dielectric insulating film by etching the low dielectric insulating film through the etching mask; a $CO_2$ plasma process for removing the etching mask by using $CO_2$ plasma after the etching process; and a UV process for irradiating UV to the low dielectric insulating film after the $CO_2$ plasma process.

The semiconductor device manufacturing method may further include a silylation process for silylating the low dielectric insulating film after the UV process.

The semiconductor device manufacturing method may further include a metal burying process for filling the groove or the hole with a conductive metal after the silylation process.

In accordance with the present disclosure, there is provided a semiconductor device manufacturing method and a semiconductor device manufacturing apparatus capable of obtaining a low dielectric insulating film in a good state by recovering a damage such as an increase of hygroscopic property or dielectric constant of the low dielectric insulating film exposed to $CO_2$ plasma, thus improving performance and reliability of a semiconductor device.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of a semiconductor device manufacturing method and a semiconductor device manufacturing apparatus in accordance with the present disclosure will be described in detail with reference to the accompanying drawings.

Figure 1:
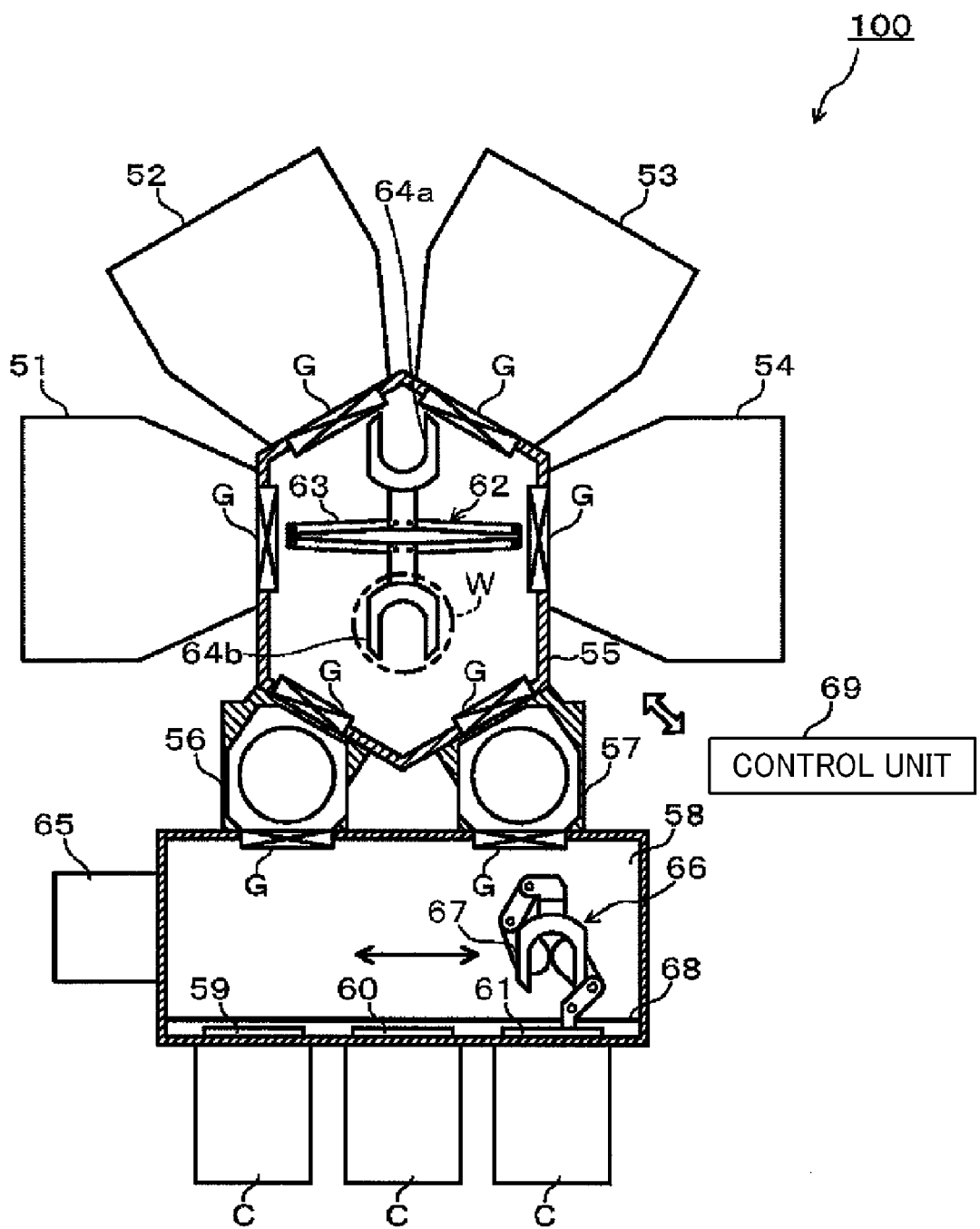
FIG. 1 is a plane view illustrating a schematic configuration of a semiconductor device manufacturing apparatus in accordance with an embodiment of the present disclosure.

FIG. 1 is a plane view illustrating a schematic configuration of a semiconductor device manufacturing apparatus 100 in accordance with an embodiment of the present invention. The semiconductor device manufacturing apparatus 100 includes an etching processing unit 51 for performing a plasma etching process on a substrate (a semiconductor wafer in the present embodiment); an ashing processing unit 52 for performing an ashing process using $CO_2$ plasma; an UV processing unit 53 for performing an UV process; and a silylation processing unit 54 for performing a silylation process. These processing units 51 to 54 are installed at four sides of a hexagonal wafer transfer chamber 55, respectively.

Further, load lock chambers 56 and 57 are respectively installed at two remaining sides of the wafer transfer chamber 55. A wafer loading/unloading chamber 58 is provided at a load lock chambers 56 and 57' side opposite to the wafer transfer chamber 55, and three ports 59 to 61 for holding three carriers C capable of accommodating wafers W therein are provided at a wafer loading/unloading chamber 58' side opposite to the load lock chambers 56 and 57.

The etching processing unit 51, the ashing processing unit 52, the UV processing unit 53, the silylation processing unit 54 and the load lock chambers 56 and 57 are connected to the respective sides of the wafer transfer chamber 55 via gate valves G, as shown in FIG. 1, so that they are allowed to communicate with the wafer transfer chamber 55 when the gate valves G are opened and they can be isolated from the wafer transfer chamber 55 when the gate valves G are closed. Further, the gate valves G are also installed at positions where the load lock chambers 56 and 57 are connected to the wafer loading/unloading chamber 58, so that the load lock chambers 56 and 57 are allowed to communicate with the wafer loading/unloading chamber 58 when the gate valves G are opened and they can be isolated from the wafer loading/unloading chamber 58 when the gate valves G are closed.

In the wafer transfer chamber 55, there is provided a wafer transfer mechanism 62 which performs loading and unloading of a wafer W with respect to the etching processing unit 51, the ashing processing unit 52, the UV processing unit 53, the silylation processing unit 54, and the load lock chambers 56 and 57. The wafer transfer mechanism 62 is positioned substantially at the center of the wafer transfer chamber 55, and it includes a rotatable•extendible/retractable unit 63 that can make retracting, extending and rotating motions. At leading ends of the rotatable•extendible/retractable unit 63, there are provided two blades 64a and 64b for holding the wafer W, and the two blades 64a and 64b are fixed to the rotatable extendible/retractable unit 63 such that they can be oriented in an opposite direction to each other. Moreover, the interior of the wafer transfer chamber 55 is maintained at a specific vacuum level.

A non-illustrated HEPA filter is provided in a ceiling portion of the wafer loading/unloading chamber 58. Clean air which has passed the HEPA filter is supplied into the wafer loading/unloading chamber 58 in a down-flow state to ensure that the tasks of loading and unloading the wafer W are carried out in a clean-air atmosphere under an atmospheric pressure. Each of the wafer loading/unloading chamber 58's three ports 59, 60 and 61 for holding the carriers C is provided with a non-illustrated shutter. The carriers C, each accommodating wafers W therein or remaining empty, are directly installed on the ports 59, 60 and 61, and the shutters are then opened so that the carriers C are allowed to communicate with the wafer loading/unloading chamber 58 while introduction of exterior air is prevented. Furthermore, an alignment chamber 65 is provided on a lateral side of the wafer loading/unloading chamber 58, and alignment of the wafer W is performed therein.

Disposed in the wafer loading/unloading chamber 58 is a wafer transfer mechanism 66 which performs loading and unloading of the wafer W with respect to the carriers C and the load lock chambers 56 and 57. The wafer transfer mechanism 66 has a multi-joint arm structure and is capable of moving along a rail 68 in an arrangement direction of the carriers C. The wafer transfer mechanism 66 is configured to transfer the wafer W by holding the wafer W with a hand provided at a leading end thereof. The entire system including the wafer transfer mechanisms 62 and 66 is controlled by a control unit 69.

Among the aforementioned processing units, each of the etching processing unit 51 and the asking processing unit 52 may be implemented by, for example, a capacitively coupled plasma processing apparatus which generates plasma by applying a high frequency power between parallel plate electrodes provided in a processing chamber. Since such a plasma processing apparatus is well-known, detailed description thereof will be omitted herein.

Figure 2:
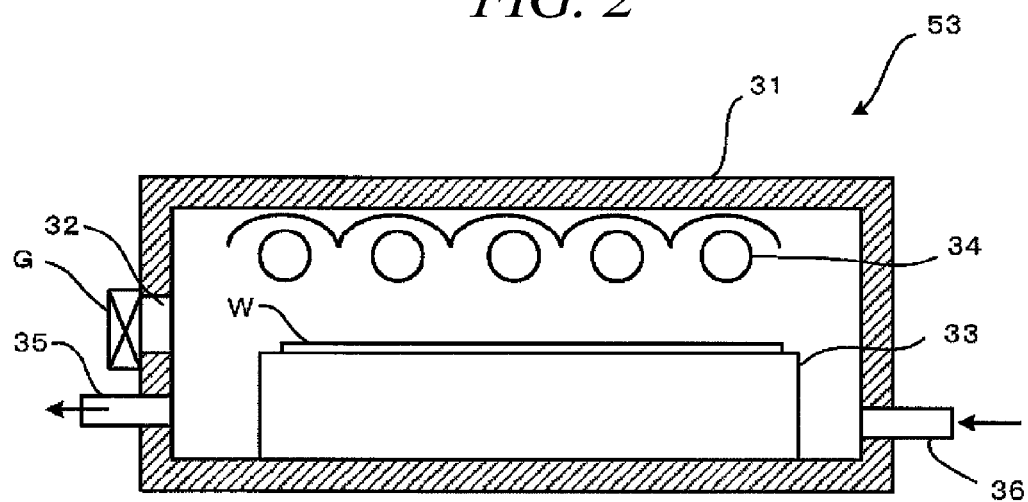
FIG. 2 is a cross sectional view illustrating a schematic configuration of a UV processing unit of the semiconductor device manufacturing apparatus of FIG. 1.

FIG. 2 is a longitudinal cross sectional view illustrating a schematic configuration of the UV processing unit 53. The UV processing unit 53 includes a chamber 31 for accommodating the wafer W therein, and the chamber 31 is provided with an opening 32 through which the wafer W is loaded and unloaded. The opening 32 is connected with the wafer transfer chamber 55 via the gate valve G.

Disposed in the chamber 31 is a hot plate 33 for mounting the wafer W and capable of heating the wafer W to a preset temperature. A UV lamp 34 for irradiating UV to the wafer W is installed in a ceiling portion of the chamber 31 to face the hot plate 33. Further, a gas exhaust pipe 35 for evacuating the inside of the chamber 31 and a nitrogen gas supply pipe 36 for supplying a nitrogen gas into the chamber 31 are connected to the chamber 31 to allow the UV irradiation to be carried out in the chamber 31 under a vacuum atmosphere or in a nitrogen gas atmosphere.

Figure 3:
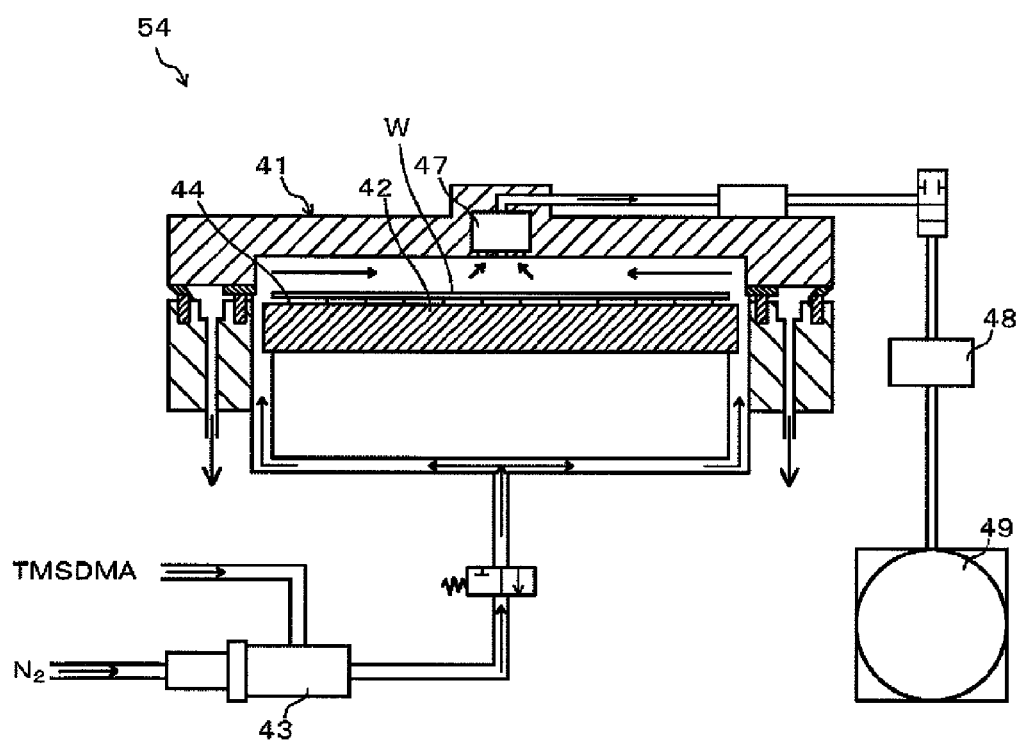
FIG. 3 is a cross sectional view illustrating a schematic configuration of a silylation processing unit of the semiconductor device manufacturing apparatus of FIG. 1.

FIG. 3 is a longitudinal cross sectional view illustrating a schematic configuration of the silylation processing unit 54. The silylation processing unit 54 includes a chamber 41 for accommodating the wafer W therein, and the chamber 41 is provided with a non-illustrated opening through which the wafer W is loaded and unloaded. The opening for the loading and unloading of the wafer W is connected to the wafer transfer chamber 55 via the gate valve G. A hot plate 42 is installed in the chamber 41, and a nitrogen gas containing a silylating agent such as TMSDMA vapor is supplied into the chamber 41 from a vicinity of the hot plate 42.

In the silylation processing unit 54 of FIG. 3, though liquid TMSDMA is vaporized by a vaporizer 43 and is contained in the nitrogen gas in a vaporizer 43, it may be also possible to supply only a vaporized TMSDMA gas (that is, TMSDMA vapor) into the chamber 41. As will be described later, since the inside of the chamber 41 is maintained at a preset vacuum level when the TMSDMA is supplied into the chamber 41, the introduction of the TMSDMA gas into the chamber 41 can be readily carried out by using a pressure difference between the vaporizer 43 and the chamber 41.

The temperature of the hot plate 42 can be controlled within a range of, e.g., about 50° C. to 200° C., and pins 44 for supporting the wafer W are provided on the surface of the hot plate 42. Since the wafer W is not directly placed on the hot plate 42, contamination of the rear surface of the wafer W can be prevented. A gas exhaust port 47 is provided at a substantially central portion of a ceiling portion of the chamber 41 to exhaust the TMSDMA-containing nitrogen gas supplied into the chamber 41, and the gas exhaust port 47 is connected with a vacuum pump 49 via a pressure controller 48.

Further, the silylation processing unit 54 includes a non-illustrated water vapor supply mechanism so that a nitrogen gas containing a certain concentration of water vapor (or only the water vapor) can be supplied into the chamber 41.

If an interlayer insulating film, which has been damaged by the etching process or asking process or whose surface has become hydrophilic, is taken out to the atmospheric atmosphere, moisture would be absorbed by the interlayer insulating film and thus its dielectric constant would increase. In the semiconductor manufacturing apparatus 100 of the present embodiment, by performing a damage recovery process within the semiconductor manufacturing apparatus 100 without exposing the wafer W to the atmospheric atmosphere after the completion of the etching and asking processes, the increase of the dielectric constant due to the moisture absorption can be prevented. In the semiconductor manufacturing apparatus 100, however, since the wafer W after the etching process is transferred from the etching processing unit 51 to the silylation process unit 54 in the vacuum atmosphere and thus a portion damaged by the etching does not absorb moisture at all. Accordingly, there is a concern that a silylation reaction may not occur readily.

In this regard, the silylation processing unit 54 is configured to be capable of supplying water vapor into the chamber 41 and enabling a proper absorption reaction at the damaged portion intentionally, thus facilitating a silylation reaction. Further, since the silylation reaction may be suppressed as opposed to the original intention if the absorption reaction progresses excessively, the supply of the water vapor needs to be controlled so as not to cause such suppression of the reaction.

Figure 4:
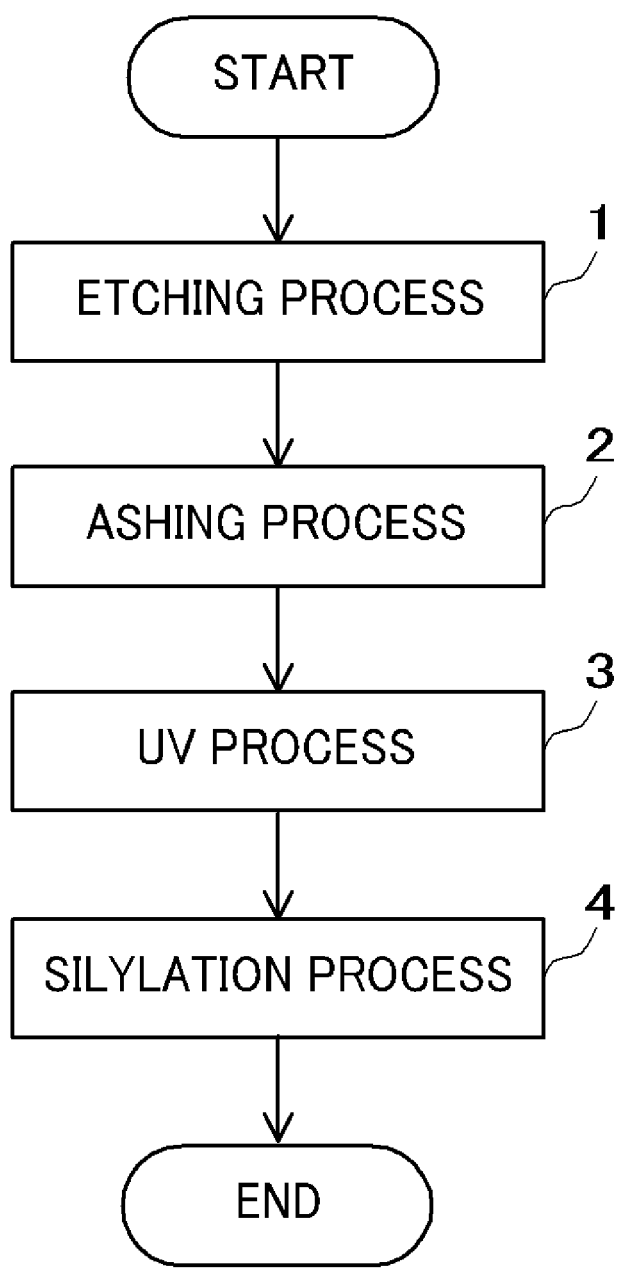
FIG. 4 is a flowchart illustrating a process sequence of a semiconductor device manufacturing method in accordance with an embodiment of the present disclosure.

Now, an embodiment of a semiconductor device manufacturing method using the above-described semiconductor device manufacturing apparatus 100 will be explained. FIG. 4 is a flowchart illustrating a process sequence of the semiconductor device manufacturing method in accordance with the embodiment of the present invention, and FIGS. 5A to 5E are enlarged diagrams illustrating cross sectional views of a wafer processed in respective steps of FIG. 4.

Figure 5A:
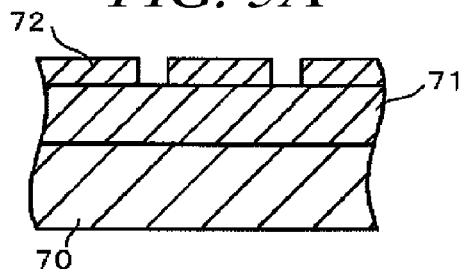
FIGS. 5A to 5E are diagrams illustrating wafer states in each process of FIG. 4.

As depicted in FIG. 5A, a wafer W is provided with a low dielectric insulating film (Low-k film) 71 formed on a base layer 70 made of silicon or the like by coating, CVD, or the like. A photoresist film 72 is formed on the low dielectric insulating film 71, and the photoresist film 72 serves as a mask having a preset pattern formed by an exposure and development process or the like. The wafer W in this state is loaded into the semiconductor device manufacturing apparatus 100.

Figure 5B:
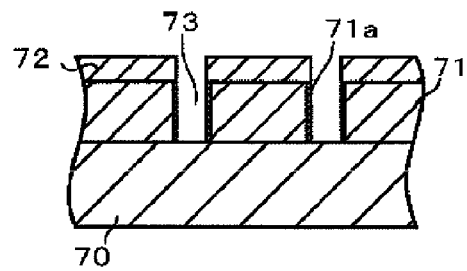

In the semiconductor device manufacturing apparatus 100, the wafer W is first loaded into the etching processing unit 52 by the wafer transfer mechanism 62 in the wafer transfer chamber 55 and is etched therein by, e.g., $CF_4$ plasma or the like (step 1 of FIG. 4). By this etching process, a hole (or groove) 73 which reaches the base layer is formed in the low dielectric insulating film 71 by using the photoresist film 72 as a mask, as depicted in FIG. 5B. Here, a reference numeral 71a in FIG. 5B indicates a damaged portion of the low dielectric insulating film 71 which is caused by the plasma etching.

Figure 5C:
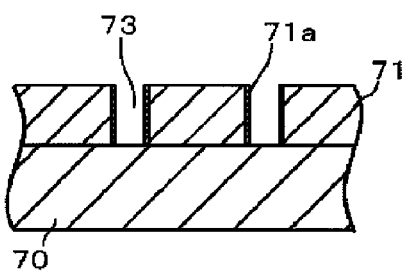

Subsequently, the wafer W is transferred from the etching processing unit 51 into the ashing processing unit 52 by the wafer transfer mechanism 62 in the wafer transfer chamber 55. Then, in the ashing processing unit 52, an ashing process by, e.g., $CO_2$ plasma is conducted (step 2 of FIG. 4). By this ashing process, the photoresist mask 72 used as the mask in the etching process is removed, as illustrated in FIG. 5C. In the ashing process, a damage different from that caused in the etching process is inflicted on the damaged portion 71a again.

Figure 5D:
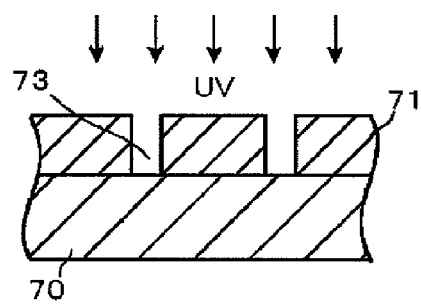

Thereafter, the wafer W is transferred from the ashing processing unit 52 into the UV processing unit 53 by the wafer transfer mechanism 62 in the wafer transfer chamber 55. Then, in the UV processing unit 53, a UV process for irradiating UV to the wafer W (low dielectric insulating film 71) is performed, as shown in FIG. 5D (step 3 of FIG. 4). The UV process by the UV processing unit 53 is carried out by irradiating UV to the entire surface of the wafer W while heating the wafer W to, e.g., about 300° C. This UV process may be performed in a vacuum atmosphere or in a nitrogen gas atmosphere.

Figure 5E:
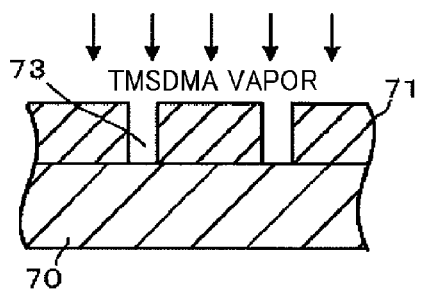

Subsequently, the wafer W is transferred from the UV processing unit 53 into the silylation processing unit 54 by the wafer transfer mechanism 62 in the wafer transfer chamber 55. Then, a silylation process is performed in the silylation processing unit 54 (step 4 of FIG. 4). The silylation process by the silylation processing unit 54 is carried out by exposing the wafer W to the silylating agent such as the TMSDMA vapor or the like, as illustrated in FIG. 5E. Processing conditions for the silylation process may be selected depending on the kind of the silylating agent. For example, the temperature of the vaporizer 43 may be appropriately set to range from a room temperature to about 50° C.; the flow rates of the silylating agent and the $N_2$ gas (purge gas) may be appropriately set to be in the range of about 0.1 to 1.0 g/min and in the range of about 1 to 10 L/min, respectively; a processing pressure may be appropriately set to range from about 666 to 95976 Pa (5 to 720 Torr); and the temperature of the hot plate 42 may be appropriately set to range from a room temperature to about 200° C.

After the completion of the silylation process, the wafer W is transferred into the load lock chamber 56 or 57 by the wafer transfer mechanism 62 in the wafer transfer chamber 55 and then is unloaded from the load lock chamber 56 or 57 into a normal pressure atmosphere.

In the above-described processes, the sidewall of the hole (or groove) 73 formed in the low dielectric insulating film 71 is damaged by the etching process using the $CF_4$ plasma or the like and the asking process using the $CO_2$ plasma or the like. To elaborate, the damaged portion may react with moisture, whereby a methyl group would decrease and a hydroxyl group would increase in the vicinity of the sidewall of the hole (or groove) 73, resulting in an increase of dielectric constant. If such damaged portion remains at the sidewall of the hole (or groove) 73, a parasitic capacitance may be increased between wirings when the wirings are formed later by filling the hole (or groove) 73 with a metal material, resulting in such problems as a signal delay, a deterioration of insulation between the wiring, and the like. Though the damaged portion 71a is schematically illustrated in FIGS. 5B and 5C, a boundary between the damaged portion 71a and an undamaged portion is not actually as clear as shown in FIGS. 5B and 5C.

In the present embodiment, the UV process by the UV processing unit 53 and the silylation process by the silylation processing unit 54 are performed to recover the damage of the low dielectric insulating film 71. By recovering the damage of the low dielectric insulating film 71, it is possible to form a wiring having highly advantageous electrical characteristics, thus enabling an improvement of reliability of a semiconductor device.

Further, in the above-described embodiment, though the above-stated respective processes are performed by a single apparatus, i.e., by the semiconductor device manufacturing apparatus 100 including the etching processing unit 51, the asking processing unit 52 and the UV processing unit 53 and the silylation processing unit 54 integrated as one body, it may be also possible to perform the respective processes by individual apparatuses. For example, it may be possible to perform the etching process and the ashing process by a single apparatus and to perform the UV process and the silylation process by a UV process apparatus and a silylation process apparatus.

Figure 6:
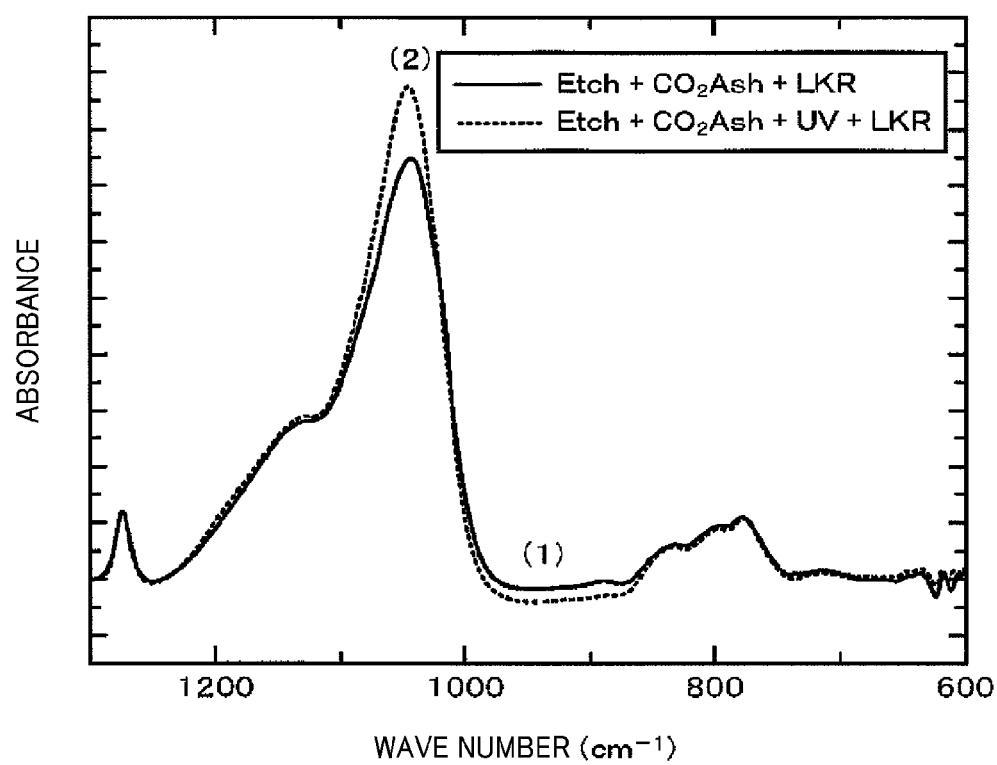
FIG. 6 is a graph showing a wafer analysis result by a fourier transform infrared spectrometer.

FIG. 6 is a graph showing an analysis result of a wafer on which an etching process of a low dielectric insulating film, an ashing process by $CO_2$ plasma, an UV process and a silylation process were performed in accordance with the above-described embodiment; and a wafer on which a conventional method of performing only an etching process of a low dielectric insulating film, an ashing process by $CO_2$ plasma and a silylation process was carried out without performing a UV process. The analysis was performed by using a fourier transform infrared spectrometer. As depicted in FIG. 6, as for the wafer on which the UV process was performed, it is found out that SiOH or SiF (portion indicated by (1) in the graph) decreases near a wave number of about 950 $cm^{-1}$, whereas SiO (portion indicated by (2) in the graph) increases near a wave number of about 1060 $cm^{-1}$. From this result, it is supposed that there occurred a condensation reaction. In the experiment, a porous MSQ (Methyl Silses Quioxane) was used as the low dielectric insulating film.

Further, in the present embodiment, it is believed that not only a simple condensation reaction of Si—OH+Si—OH→Si—O—Si (siloxane structure)+$H_2O$ but also reactions similar to the condensation reaction such as a reaction of Si—F+SiOH→Si—O—Si+HF and a reaction of Si—F+Si—F→Si—O—Si+F$_2$ also occur at the same time, so that Si—F components in the low dielectric insulating film as well as Si—OH components therein decrease, thereby reducing polarization in the low dielectric insulating film greatly and thus enabling improvement of characteristics of the low dielectric insulating film.

Figure 7:
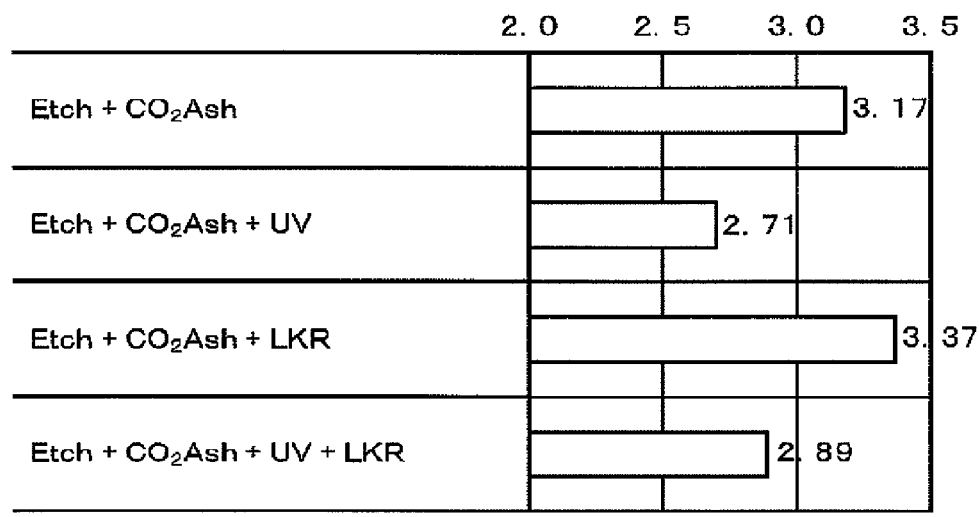
FIG. 7 is a graph showing a measurement result of a dielectric constant of a low dielectric insulating film.

FIG. 7 shows, in sequence from the top, measurement results of dielectric constants (k values) of low dielectric insulating films in respective cases of performing only an etching process and an ashing process; only a UV process after the etching and the ashing processes; only a silylation process (LKR) after the etching and the ashing processes; and both the UV process and the silylation process (LKR) after the etching and the ashing processes. Further, the dielectric constant of the low dielectric insulating film was about 2.4 before the etching process and the ashing process, and a porous MSQ (Methyl Silses Quioxane) was used as the low dielectric insulating film.

As depicted in FIG. 7, it was proved that though the dielectric constant of the low dielectric insulating film cannot be reduced when only the silylation process (LKR) is performed after the etching process and the ashing process, the dielectric constant of the low dielectric insulating film can be decreased by performing the UV process. Furthermore, in the example shown in FIG. 7 (the second one from the top), the dielectric constant of the low dielectric insulating film is reduced by performing only the UV process without performing the silylation process. However, the UV process is basically not a reaction for allowing a film to have a hydrophobic property, so that the insulating film's portion whose dielectric constant is reduced by the UV process may be dissolved in a hydrofluoric acid based solution or the like which may be used in a post process. For the reason, the hydrophobic property of the film surface desirably needs to be as high as possible, and it is therefore desirable to perform the silylation process (LKR) as well as the UV process.

Figure 8:
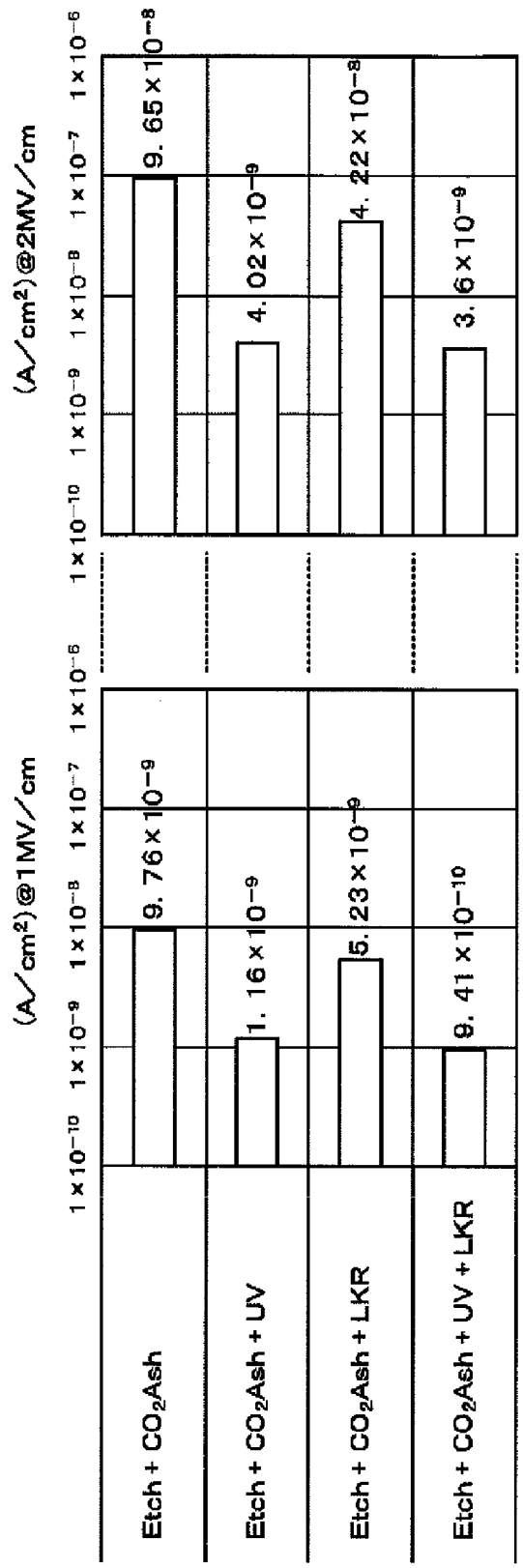
FIG. 8 is a graph showing a measurement result of a leakage current density of a low dielectric insulating film.

FIG. 8 shows, in sequence from the top, measurement results of leakage current densities in respective cases of performing only the etching process and the ashing process; only the UV process after the etching and the ashing processes; only the silylation process (LKR) after the etching and the ashing processes; and both the UV process and the silylation process (LKR) after the etching and the ashing processes. Further, the left side of FIG. 8 indicates a case of applying an electric field of about 1 MV/cm and the right side thereof indicates a case of applying an electric field of about 2 MV/cm. Further, the measurements of the leakage current densities and the above-stated dielectric constants were carried out by performing the above-described respective processes on the low dielectric insulating film formed on the entire surface of the wafer; forming an electrode made of a aluminum film on the surface thereof by using a sputtering method; and then applying a voltage between the front surface and the rear surface of the wafer. Further, a porous MSQ (Methyl Silses Quioxane) was used as the low dielectric insulating film.

As depicted in FIG. 8, it was proved that though the leakage current is slightly reduced when only the silylation process (LKR) is performed after the etching process and the asking process, the leakage current can be more greatly reduced by as much as about one digit place by performing the UV process.

Moreover, if a loss of a current flowing in a circuit is caused by the leakage current, current consumption increases. Further, since there is a likelihood that a defect may have been generated at a position where the leakage current flows, a degradation of the circuit such as diffusion of Cu wiring into the insulating film or the like may be caused with the lapse of time. Moreover, if a current flows in a circuit which is not originally supposed to flow the current therein, a malfunction of the circuit may be resulted. In view of the mentioned reasons, it is desirable to reduce the leakage current.

Figure 9:
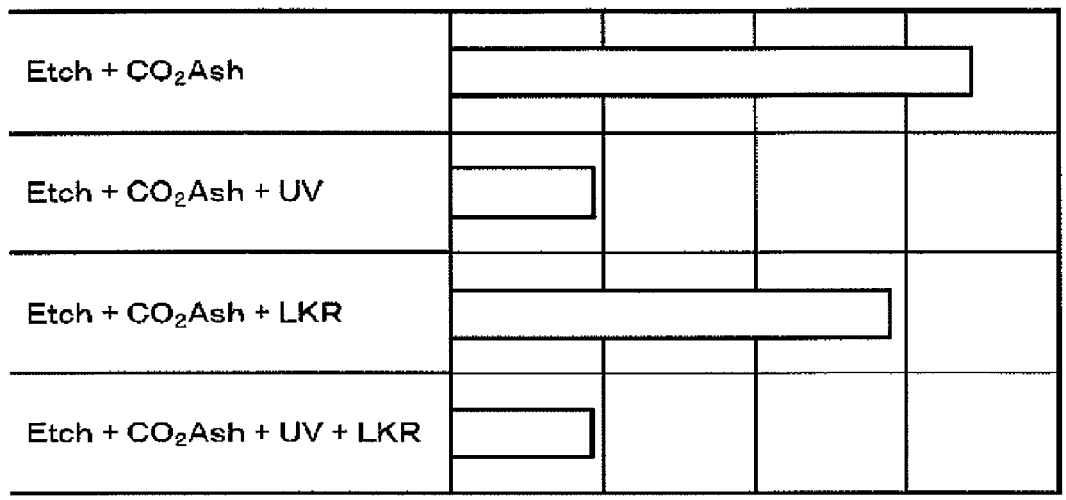
FIG. 9 is a graph showing a measurement result of a moisture amount of a low dielectric insulating film.

FIG. 9 shows, in sequence from the top, measurement results of moisture amounts in low dielectric insulating films in respective cases of performing only the etching process and the ashing process; only the UV process after the etching and the ashing processes; only the silylation process (LKR) after the etching and the ashing processes; and both the UV process and the silylation process (LKR) after the etching and the ashing processes. The moisture amount was computed by measuring the amount of desorption gas when the temperature of the wafer W was increased by 1° C. every second by employing mass spectrometry (mass=18 (H$_2$O)). Further, a porous MSQ (Methyl Silses Quioxane) was used as the low dielectric insulating film.

As depicted in FIG. 9, it was proved that though the moisture amount is slightly reduced when only the silylation process (LKR) is performed after the etching process and the ashing process, the moisture amount can be reduced to about ⅓ by performing the UV process.

Furthermore, since moisture increases the mobility of electric charges, it causes an increase of a leakage current between wirings. If a film absorbs moisture, it implies that the film has a structure readily allowing a movement of electric charges. Further, since water itself has a high dielectric constant, it may cause an increase of the dielectric constant of the low dielectric insulating film. In addition, since the moisture serves as a factor that oxidizes a metal wiring such as Cu, it may leads to an increase of wiring resistance, resulting in an increase of power consumption. In consideration of the above-mentioned reasons, it is desirable to reduce the moisture amount in the low dielectric insulating film.

Figure 10:
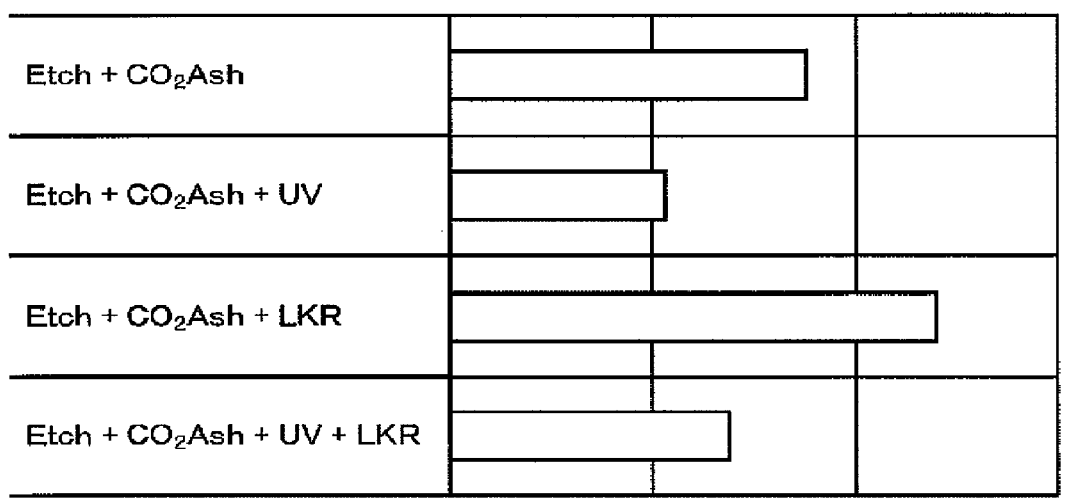
FIG. 10 is a graph showing a measurement result of an amount of fluorine components of a low dielectric insulating film.

FIG. 10 shows, in sequence from the top, measurement results of the amount of fluorine components of low dielectric insulating films in respective cases of performing only the etching process and the ashing process; only the UV process after the etching and the ashing processes; only the silylation process (LKR) after the etching and the ashing processes; and both the UV process and the silylation process (LKR) after the etching and the ashing processes. The amount of fluorine components was computed by measuring an amount of desorption gas when the temperature of the wafer W was increased by 1° C. every second by employing mass spectrometry (mass=19 (F)). Further, a porous MSQ (Methyl Silses Quioxane) was used as the low dielectric insulating film.

As depicted in FIG. 10, it was proved that though the fluorine components are not reduced when only the silylation process (LKR) is performed after the etching process and the ashing process, the fluorine components can be reduced to about ⅔ by performing the UV process.

Since fluorine has high electronegativity, it is highly likely that the polarity of the film structure of the low dielectric insulating film may be increased if the fluorine remains in the low dielectric insulating film. Thus, by attracting moisture, the dielectric constant may increase, whereby the dielectric constant of the insulating film itself is highly likely to increase. Further, in case that the fluorine remains in the low dielectric insulating film, there is a likelihood that the fluorine may be ionized by a slight amount of water in the atmospheric atmosphere or the insulating film with the lapse of time, resultantly dissolving the low dielectric insulating film. In view of the forgoing reasons, it is desirable to reduce the fluorine components in the low dielectric insulating film.

Figure 11:
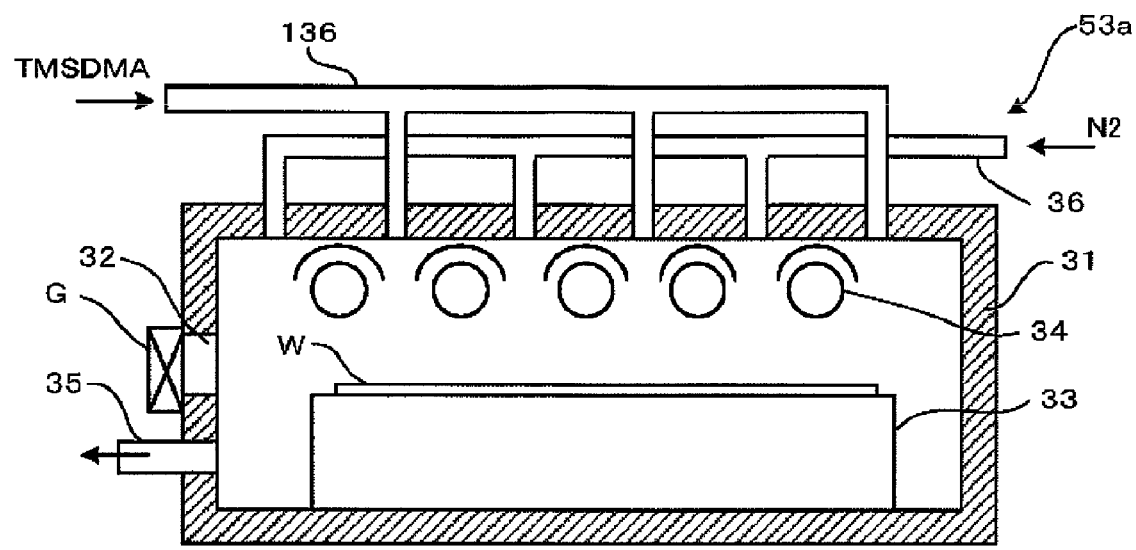
FIG. 11 is a cross sectional view illustrating a schematic configuration of a processing unit for performing a UV process and a silylation process.

FIG. 11 illustrates a configuration of a UV processing unit 53a configured to perform a UV process and a silylation process (LKR) in a single chamber. The UV processing unit 53a includes a chamber 31 for accommodating a wafer W therein, and the chamber 31 is provided with an opening 32 through which the wafer W is loaded and unloaded. The opening 32 is connected with the wafer transfer chamber 55 via the above-described gate valve G.

Inside the chamber 31, there is installed a hot plate 33 for holding the wafer W and heating the wafer to a preset temperature. A UV lamp 34 for irradiating UV to the wafer W is installed in a ceiling portion of the chamber 31 to face the hot plate 33. Further, a nitrogen gas supply pipe 36 for supplying a nitrogen gas into the chamber 31 is connected to the ceiling portion inside the chamber 31, and a TMSDMA vapor supply pipe 136 for supplying vapor of a silylating agent (TMSDMA in the present embodiment) into the chamber 31 is also connected to the ceiling portion inside the chamber independently of the nitrogen gas supply pipe 36. In addition, a gas exhaust pipe 35 for evacuating the inside of the chamber 31 is also connected to the chamber 31.

In the UV processing unit 53a configured as described above, a UV process can be performed in the chamber 31 under a vacuum atmosphere or a nitrogen gas atmosphere. Further, a silylation process can be consecutively performed in the same chamber 31 under a mixed atmosphere of a nitrogen gas and TMSDMA vapor by introducing the TMSDMA vapor from the TMSDMA vapor supply pipe 136 while concurrently introducing the nitrogen gas from the nitrogen gas supply pipe 36.

Further, since the nitrogen gas supply pipe 36 and the TMSDMA vapor supply pipe 136 are separated, a highly pure nitrogen gas atmosphere without containing the TMSDMA vapor mixed therein can be generated promptly, and the nitrogen gas/TMSDMA vapor mixed atmosphere can also be generated promptly. Accordingly, processing time can be reduced when the UV process and the silylation process (LKR) are consecutively carried out.

Figure 12:
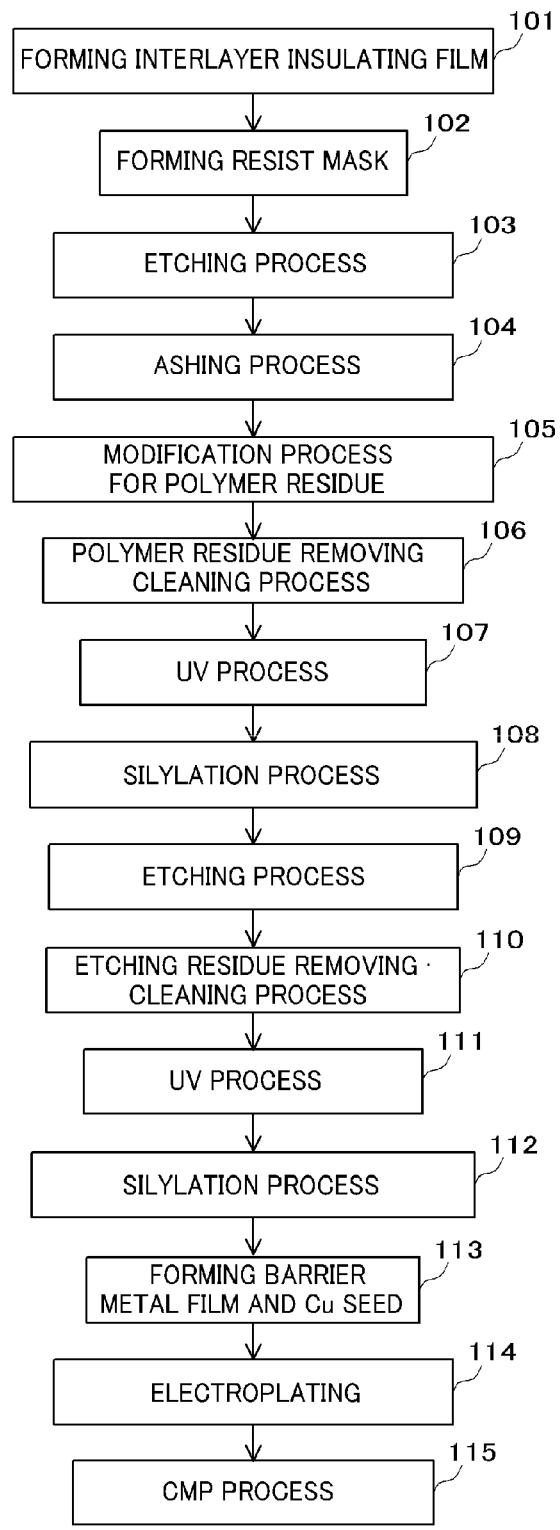
FIG. 12 is a flowchart for describing a process sequence for forming a groove wiring having a single damascene structure.

Now, application of the present invention to a wiring process using a single damascene method will be explained in accordance with an embodiment of the present invention with reference to FIG. 12 and FIGS. 13A to 13H. FIG. 12 is a flowchart for illustrating a process sequence for forming a groove wiring having a single damascene structure and FIGS. 13A to 13H are diagrams schematically showing a change of the shape of the groove wiring formed in each process of FIG. 12.

First, there is prepared a wafer W (wafer W itself is not illustrated) including an insulating film 170 in which a lower wiring (Cu wiring) 172 is formed with a barrier metal layer 171 therebetween and a stopper film 173 made of, e.g., a SiN film or a SiC film formed on the surface of the insulating film 170. An interlayer insulating film 174 made of a low dielectric insulating film (for example, porous MSQ or the like) is formed on the stopper film 173 of the wafer W (step 101, FIG. 13A).

Figure 13A:
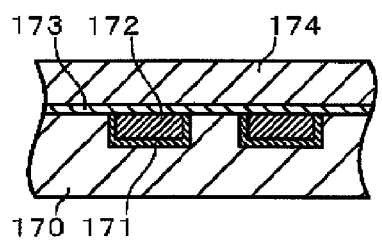
FIGS. 13A to 13H are diagrams schematically illustrating a change in the shape of the groove wiring formed according to the process sequence of FIG. 12.
Figure 13B:
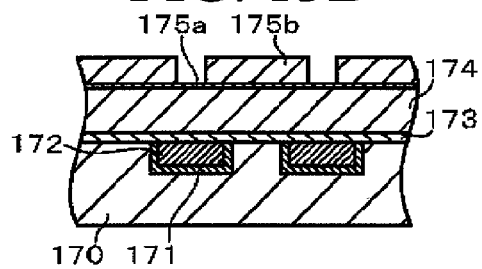

Then, an antireflection film 175a and a resist film 175b are sequentially formed on the interlayer insulating film 174, and by performing an exposure and development process, the resist film 175b becomes a resist mask with a preset pattern (step 102, FIG. 13B).

Figure 13C:
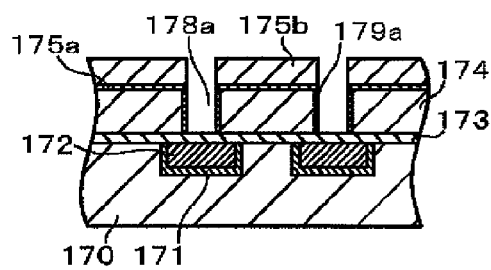

Then, an etching process for etching the interlayer insulating film 174 is performed by using the resist mask, whereby a via 178a that reaches the stopper film 173 is formed in the interlayer insulating film 174 (step 103, FIG. 13C).

Figure 13D:
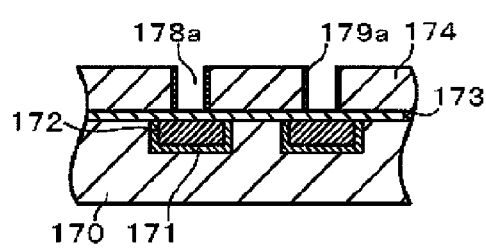

Subsequently, an asking process for removing the antireflection film 175a and the resist film 175b is performed by $CO_2$ plasma (step 104, FIG. 13D). In FIGS. 13C and 13D, a reference numeral 179a indicates a damaged portion.

Then, there is performed a modification process for modifying polymer residues or the like remaining on the wafer W after the etching or the ashing process, thus rendering them water soluble (step 105). Thereafter, a cleaning process for removing the modified polymer residues or the like is conducted (step 106).

As stated, the sidewall of the via 178a formed in the interlayer insulating film 174 is damaged by the etching process, the ashing process, or the subsequent washing process. To elaborate, the damaged portion reacts with moisture, whereby a methyl group decreases and a hydroxyl group increases in the vicinity of the sidewall of the via 178a, resulting in an increase of dielectric constant. If the via 178a is later filled with a metal material to form a groove wiring in the state that such a damaged portion exists on the sidewall of the via 178a, a parasitic capacitance between wirings would be increased, resulting in problems such as a signal delay, a deterioration of insulation between the groove wirings, and so forth. Though the damaged portion 179a is schematically illustrated in FIGS. 13C and 13D, a boundary between the damaged portion 179a and an undamaged portion is not actually as clear as shown in FIGS. 13C and 13D.

Figure 13E:
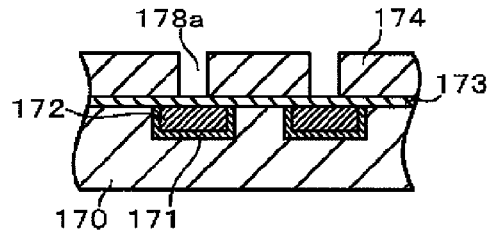

Subsequently, a UV process for irradiating UV to the wafer W is performed (step 107), and a silylation process is then carried out (step 108), whereby the damaged portion 179a of the interlayer insulating film 174 is recovered (FIG. 13E).

Figure 13F:
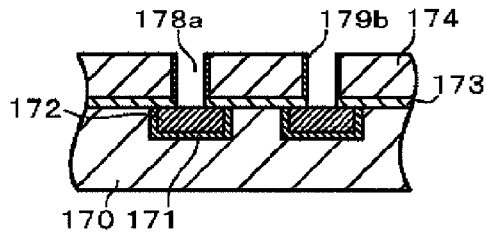

Afterward, an etching process for removing the stopper film 173 is performed (step 109), and a cleaning process for removing etched residues is then conducted (step 110, FIG. 13F).

Figure 13G:
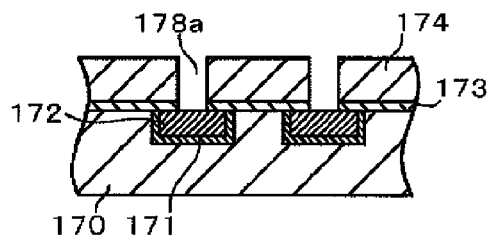
Figure 13H:
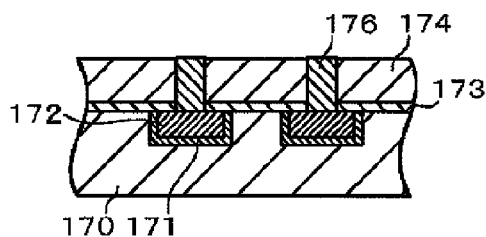

The sidewall of the via 178a formed in the interlayer insulating film 174 may be damaged by this etching process or the cleaning process again, so that a damaged portion 179b is formed. Thus, a UV process for irradiating UV to the wafer W is subsequently conducted (step 111), and a silylation process is then carried out (step 112), whereby the damaged portion 179b of the interlayer insulating film 174 is recovered (FIG. 13G). As described, it may be possible to perform the UV process and the silylation process for damage recovery even in case that only the etching process is performed on the interlayer insulating film 174 without conducting an asking process by $CO_2$ plasma or the like. In such a case, it may be also desirable to perform only the silylation process without performing the UV process.

Thereafter, a barrier metal film and a Cu seed layer (i.e., plating seed layer) are formed on the inner wall of the via 178a (step 113). Then, the via 178a is filled with a metal 176 such as copper by electroplating (step 114). Afterward, an annealing process of the metal 176 buried in the via 178a is performed by heating the wafer W, and a planarization process is performed by a CMP method (step 115, FIG. 13H).

In accordance with the above-described groove wiring forming method, even in case that the sidewall of the via 178a formed in the interlayer insulating film is damaged by etching, ashing or cleaning, the damaged portion can be recovered by the UV process and the silylation process. Thus, a groove wiring having advantageous electrical characteristics can be formed, so that the reliability of the semiconductor device can be improved.

Though the above description has been provided for the case of performing the UV process and the silylation process after the cleaning process is completed, it may be possible to perform the UV process and the silylation process after a certain process in the event that a damage has been inflicted or is likely to be inflicted on the interlayer insulating film 174 by that process. For example, it may be also desirable to perform the UV process and the silylation process immediately after the ashing process of step 104 instead of or in addition to performing those processes after the cleaning process.

Figure 14:
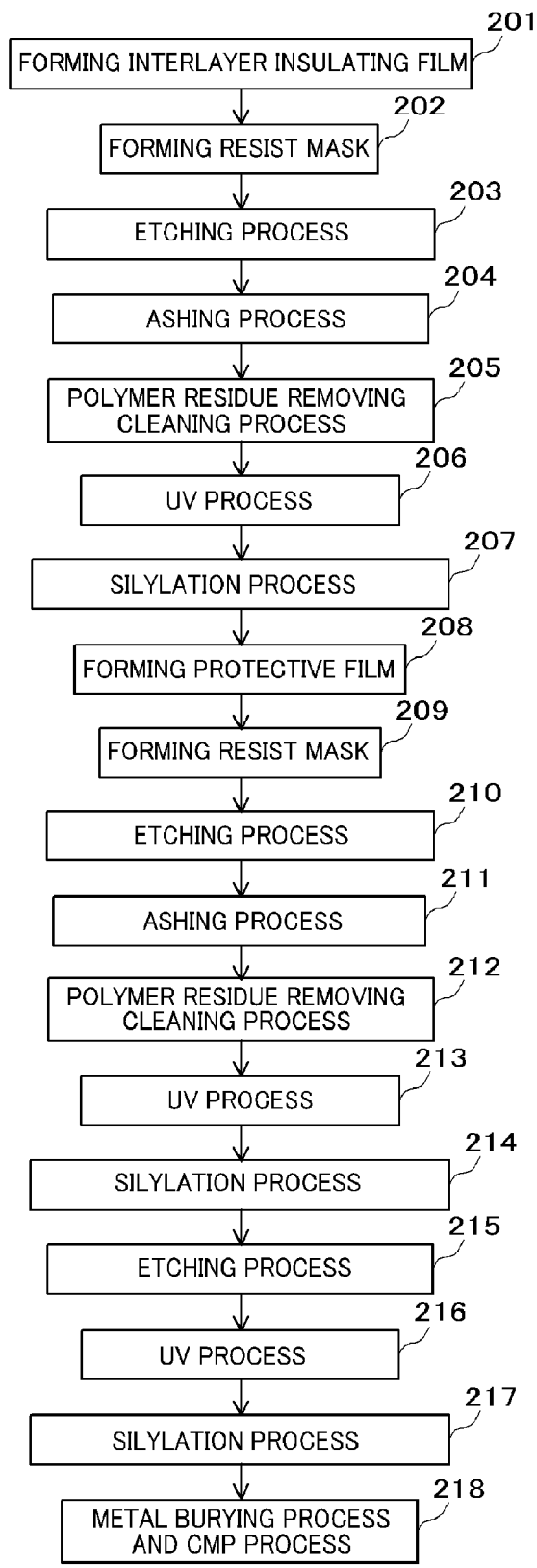
FIG. 14 is a flowchart for describing a process sequence for forming a groove wiring having a dual damascene structure.

Now, another method for forming a groove wiring in an interlayer insulating film formed on a wafer W will be explained with reference to FIG. 14 and FIGS. 15A to 15I. FIG. 14 is a flowchart for illustrating a process sequence for forming a groove wiring having a dual damascene structure and FIGS. 15A to 15I are diagrams schematically showing a change of the shape of the groove wiring formed in each process of FIG. 14.

First, there is prepared a wafer W (wafer W itself is not illustrated) including an insulating film 170 in which a lower wiring (Cu wiring) 172 is formed with a barrier metal layer 171 therebetween and a stopper film 173 made of, e.g., a SiN film or a SiC film formed on the surface of the insulating film 170. An interlayer insulating film 174 made of a low dielectric insulating film (for example, porous MSQ or the like) is formed on the stopper film 173 of the wafer W (step 201, FIG. 15A).

Then, an antireflection film 175a and a resist film 175b are sequentially formed on the interlayer insulating film 174. Thereafter, a resist mask having a preset pattern is obtained by exposing and developing the resist film 175b (step 202, FIG. 15B).

Figure 15A:
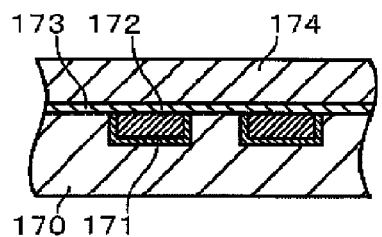
FIGS. 15A to 15I are diagrams schematically illustrating a change in the shape of the groove wiring formed according to the process sequence of FIG. 14.
Figure 15B:
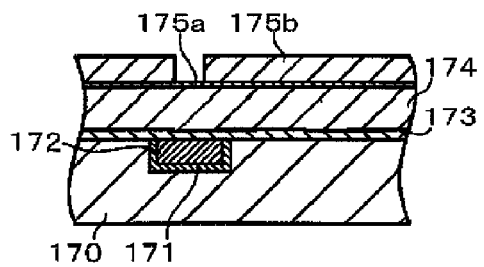
Figure 15C:
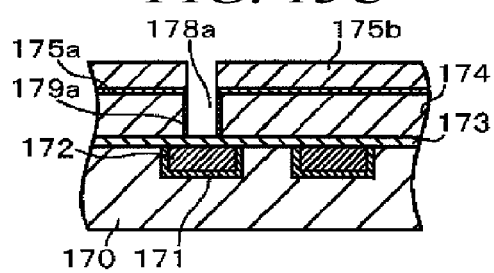

Then, an etching process is performed by using the resist film 175b as an etching mask, whereby a via 178a that reaches the stopper film 173 is formed (step 203, FIG. 15C). In FIG. 15C, a reference numeral 179a indicates a damaged portion generated by the etching process.

Subsequently, an ashing process is performed by $CO_2$ plasma, whereby the antireflection film 175a and the resist film 175b are removed (step 204), and a cleaning process for removing polymer residues or the like generated by the previous etching process or ashing process is carried out (step 205).

Figure 15D:
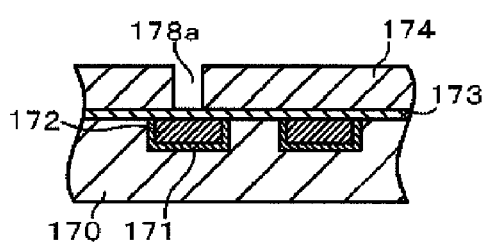
Figure 15E:
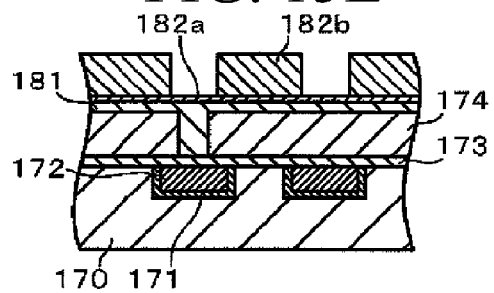

Thereafter, a UV process for irradiating UV to the wafer W is performed (step 206), and a silylation process is subsequently carried out (step 207), whereby the damaged portion 179a of the interlayer insulating film 174 is recovered (FIG. 15D).

Then, a protective film 181 is formed on the surface of the interlayer insulating film 174 (step 208). Then, an antireflection film 182a and a resist film 182b are sequentially formed on the protective film 181, and the resist film 182b is subjected to an exposure and development process using a preset pattern, so that the resist film 182b becomes a resist mask having the preset pattern (step 209, FIG. 15E). The protective film 181 can be formed by spin-coating a preset liquid chemical. The protective film 181 is optional, and thus it may be possible to form the antireflection film 182a and the resist film 182b directly on the interlayer insulating film 174.

Figure 15F:
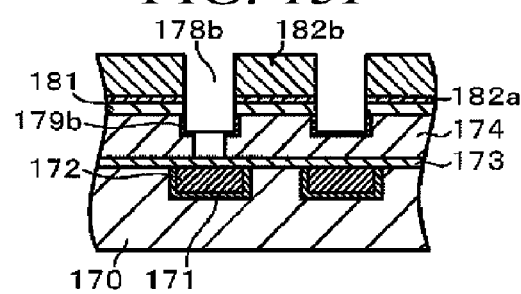

Subsequently, an etching process is performed by using the resist mask made of the resist film 182b, whereby a trench 178b is formed in the interlayer insulating film 174 (step 210, FIG. 15F). Then, the resist film 182b and the antireflection film 182a are removed by an ashing process using $CO_2$ plasma (step 211). A reference numeral 179b shown in FIG. 15F is a damaged portion caused by the etching process in step 210.

Figure 15G:
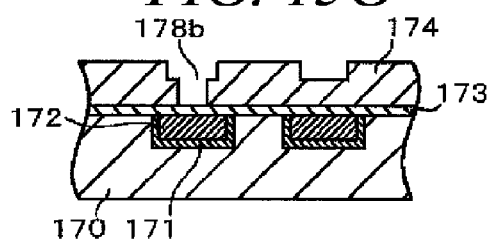

Thereafter, a cleaning process for removing polymer residues generated by the previous etching or ashing process, the protective film 181, and the like are carried out (step 212). Afterward, a UV process for irradiating UV to the wafer W is conducted (step 213), and a silylation process is subsequently performed (Step 214), whereby the damaged portion 179b of the interlayer insulating film 174 is recovered (FIG. 15G).

Figure 15H:
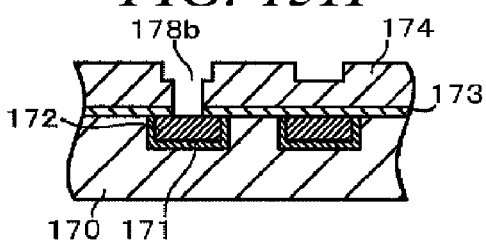

Subsequently, an etching process for removing the stopper film 173 and a subsequent residue removing process are conducted (step 215). Then, a UV process for irradiating UV to the wafer W is performed (step 216), and a silylation process is then conducted (step 217), whereby damaged portions formed at the via 178a and the trench 178b by the etching process are recovered (FIG. 15H). FIG. 15H illustrates a state after the completion of the silylation process.

Figure 15I:
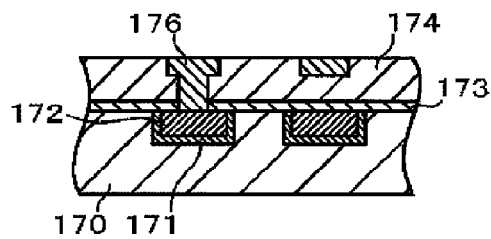

Afterward, a barrier metal film and a Cu seed layer are formed on the inner walls of the via 178a and the trench 178b; a plug is formed by filling the via 178a and the trench 178b with a metal 176 such as copper by electroplating; an annealing process of the metal 176 buried in the via 178a and the trench 178b is performed by heating the wafer W; and a planarization process is performed by a CMP method (step 218, FIG. 15I).

Figure 16:
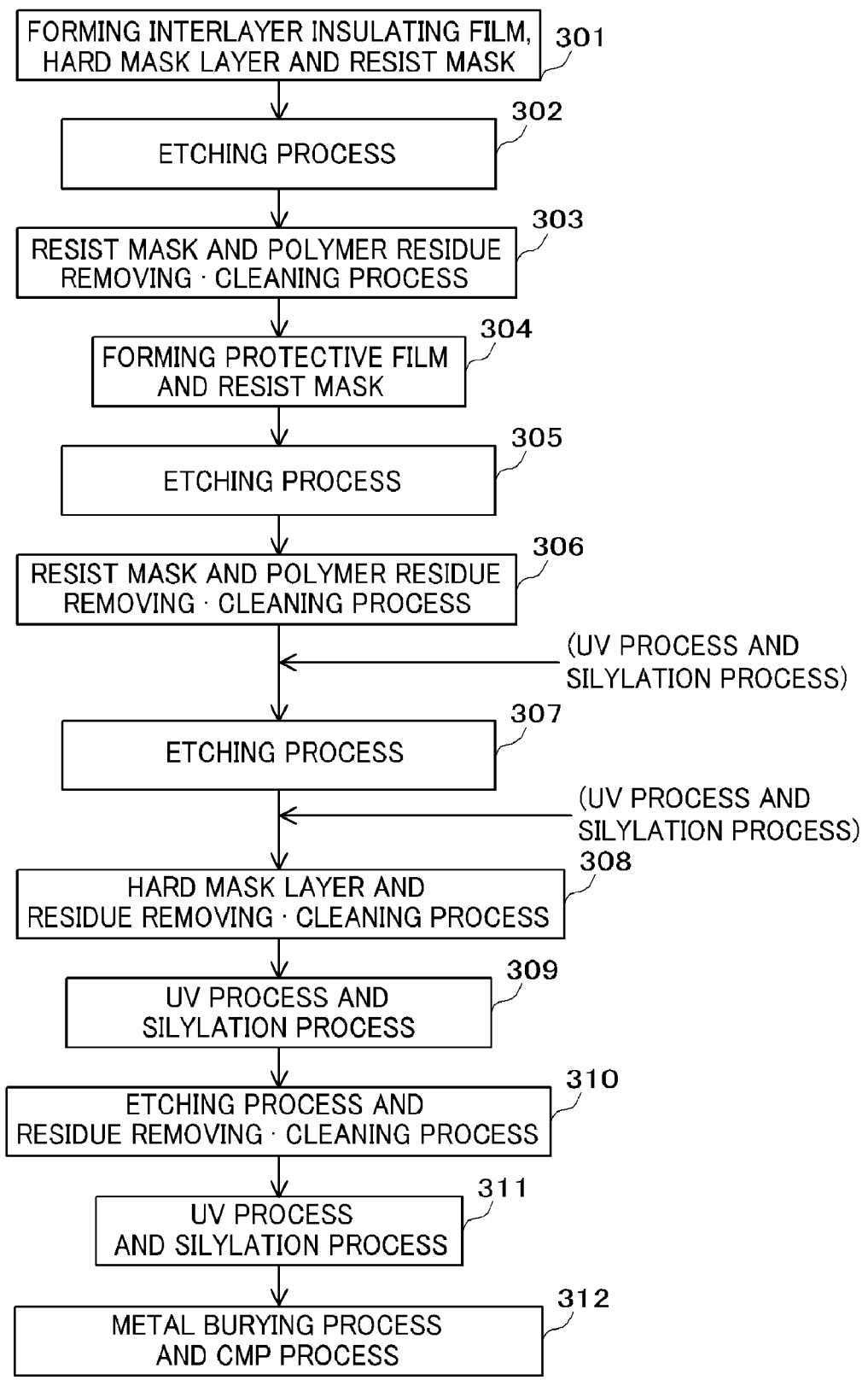
FIG. 16 is a flowchart for describing another process sequence for forming a groove wiring having a single damascene structure.

Now, still another method for forming a groove wring in an interlayer insulating film formed on a wafer W will be explained with reference to FIGS. 16 and FIGS. 17A to 17H. FIG. 16 is a flowchart for illustrating another process sequence for forming a groove wiring having a dual damascene structure, and FIGS. 17A to 17H are diagrams schematically showing a change of the shape of the groove wiring formed in each process of FIG. 16.

First, there is prepared a wafer W (wafer W itself is not illustrated) including an insulating film 170 in which a lower wiring (Cu wiring) 172 is formed with a barrier metal layer 171 therebetween and a stopper film 173 made of, e.g., a SiN film or a SiC film formed on the surface of the insulating film 170. An interlayer insulating film 174 made of a low dielectric insulating film (for example, porous MSQ or the like), a hard mask layer 186, an antireflection film 187a and a resist film 187b are sequentially formed on the stopper film 173 of the wafer W, and a resist mask is obtained by exposing and developing the resist film 187b by using a preset pattern (step 301, FIG. 17A).

Figure 17A:
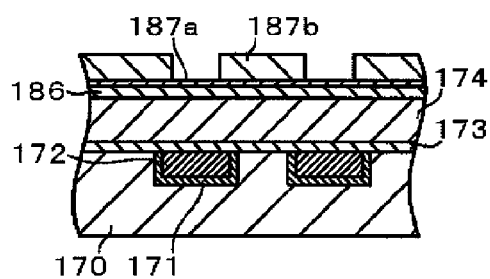
FIGS. 17A to 17H are diagrams schematically illustrating a change in the shape of the groove wiring formed according to the process sequence of FIG. 16.
Figure 17B:
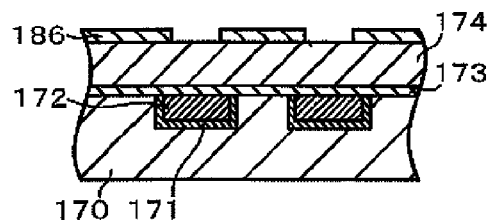

Then, an etching process is performed by using the resist film 187b as an etching mask (step 302) to thereby pattern the hard mask layer 186, and the antireflection film 187a and the resist film 187b are then removed (step 303, FIG. 17B).

Figure 17C:
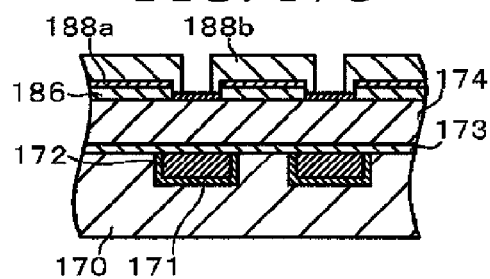

Subsequently, an antireflection film 188a and a resist film 188b are sequentially formed on the hard mask layer 186, and a resist mask is obtained by exposing and developing the resist film 188b by using a preset pattern (step 304, FIG. 17C).

Figure 17D:
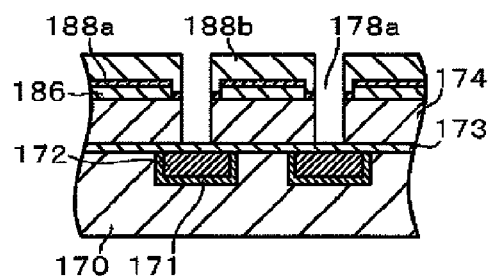
Figure 17E:
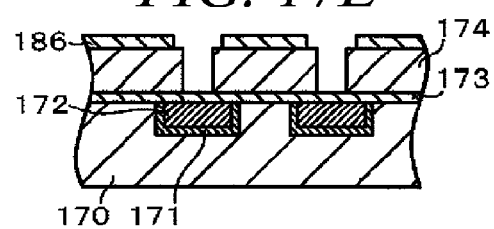

Thereafter, a via 178a that reaches the stopper film 173 is formed by using the resist mask made of the resist film 188b (step 305, FIG. 17D). Then, the resist film 188b and the antireflection film 188a are removed by an ashing process using $CO_2$ plasma or the like and a polymer residue removing•cleaning process is conducted (step 306, FIG. 17E).

In case that a damaged portion is generated at the interlayer insulating film 174 after the ashing process and the polymer residue removing•cleaning process, a UV process and a silylation process may be conducted subsequently.

Since the hard mask layer 186 having the preset pattern is exposed after the completion of step 306, a trench 178b is formed by performing an etching process while using the hard mask layer 186 as an etching mask (step 307). At this time, if a damaged portion is generated at the interlayer insulating film 174, a UV process and a silylation process can be immediately performed.

Then, the hard mask layer 186 is removed by an asking process using $CO_2$ plasma or a liquid chemical process (step

Figure 17F:
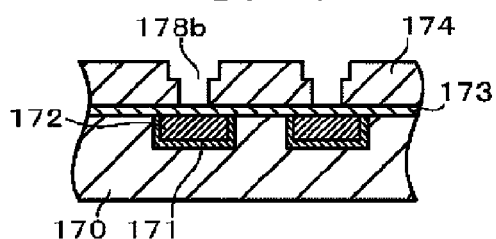
Figure 17G:
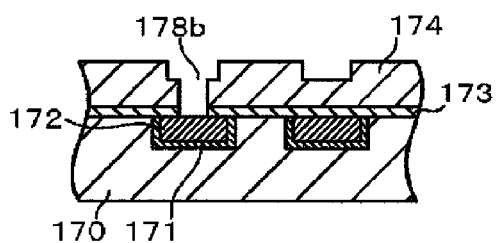

308, FIG. 17F). For example, a UV process and a silylation process are conducted after the removal of the hard mask layer 186 (step 309), whereby a damaged portion generated at the interlayer insulating film 174 in or before step 308 can be recovered. Further, FIG. 17F shows a state after the damage is recovered.

Thereafter, an etching process for removing the stopper film 173 and a residue removing•cleaning process are conducted (step 310, FIG. 17G), and a UV process and a silylation process are carried out again to recover a damaged portion generated at the via 178a and the trench 178b because of the etching process or the like (step 311).

Figure 17H:
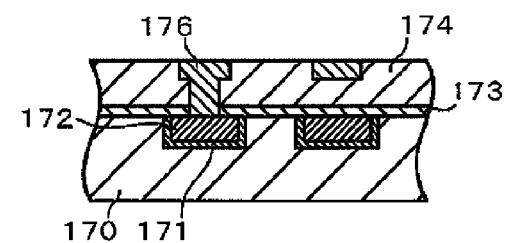

Then, a barrier metal film and a Cu seed layer are formed on the inner walls of the via 178a and the trench 178b, and a plug is formed by filling the via 178a and the trench 178b with a metal 176 such as copper by electroplating, and an annealing process of the metal 176 buried in the via 178a and the trench 178b is performed by heating the wafer W, and a planarization process is performed by a CMP method (step 312, FIG. 17H).

While the invention has been described with respect to the embodiments, it will be understood by those skilled in the art that various changes and modifications may be made.

What is claimed is:

1. A semiconductor device manufacturing method comprising:
    an etching process for etching a low dielectric insulating film formed on a substrate;
    a $CO_2$ plasma process for exposing the substrate to $CO_2$ plasma after the etching process;
    a UV process for irradiating UV to the low dielectric insulating film after the $CO_2$ plasma process to reduce polarization in the low dielectric insulation film; and
    a silylation process for silylating the low dielectric insulating film after the UV process.

2. The manufacturing method of claim 1, wherein the $CO_2$ plasma process is a $CO_2$ plasma ashing process for removing a photoresist layer used as an etching mask in the etching process.

3. The manufacturing method of claim 1, wherein the $CO_2$ plasma process is a cleaning process for removing deposits generated in the etching process.

4. A semiconductor device manufacturing method comprising:
    a mask forming process for forming an etching mask, which has a preset circuit pattern, on a surface of a low dielectric insulating film formed on a substrate;
    an etching process for forming a groove or a hole in the low dielectric insulating film by etching the low dielectric insulating film through the etching mask;
    a $CO_2$ plasma process for removing the etching mask by using $CO_2$ plasma after the etching process;
    a UV process for irradiating UV to the low dielectric insulating film after the $CO_2$ plasma process to reduce polarization in the low dielectric insulation film; and
    a silylation process for silylating the low dielectric insulating film after the UV process.

5. The manufacturing method of claim 4, further comprising:
    a metal burying process for filling the groove or the hole with a conductive metal after the silylation process.

* * * * *

UNITED STATES PATENT AND TRADEMARK OFFICE
CERTIFICATE OF CORRECTION

| | |
|---|---|
| PATENT NO. | : 8,101,507 B2 |
| APPLICATION NO. | : 12/580495 |
| DATED | : January 24, 2012 |
| INVENTOR(S) | : Ryuichi Asako et al. |

It is certified that error appears in the above-identified patent and that said Letters Patent is hereby corrected as shown below:

Column 1, line 20, replace "asking" with -- ashing --

Column 5, line 47, insert the number -- 67 -- between "hand" and "provided"

Column 6, line 45, replace "asking" with -- ashing --

Column 7, line 26, insert the number -- 70 -- between "layer" and "is"

Column 8, line 38, replace "asking" with -- ashing --

Column 11, line 20, insert the number -- 31 -- between "chamber" and "independently"

Column 12, line 1, replace "asking" with -- ashing --

Column 12, line 45, replace "asking" with -- ashing --

Column 14, line 66, replace "asking" with -- ashing --

Signed and Sealed this
Eighth Day of May, 2012

David J. Kappos
*Director of the United States Patent and Trademark Office*